United States Patent [19]
Sturm et al.

[11] Patent Number: 6,087,196
[45] Date of Patent: Jul. 11, 2000

[54] FABRICATION OF ORGANIC SEMICONDUCTOR DEVICES USING INK JET PRINTING

[75] Inventors: James C. Sturm, Princeton, N.J.; Chung Chih Wu, Taipei, Taiwan; Duane Marcy, Ewing; Thomas R. Hebner, Princeton, both of N.J.

[73] Assignee: The Trustees of Princeton University, Princeton, N.J.

[21] Appl. No.: 09/238,708

[22] Filed: Jan. 28, 1999

Related U.S. Application Data

[60] Provisional application No. 60/073,068, Jan. 30, 1998.

[51] Int. Cl.[7] .................................................. H01L 51/40
[52] U.S. Cl. ........................... 438/29; 438/99; 438/149; 438/164; 438/237; 438/328; 427/466; 427/469
[58] Field of Search .................... 438/99, 584, 237, 438/328, 149, 164, 29, 30; 427/466, 469

[56] References Cited

U.S. PATENT DOCUMENTS

| | | | |
|---|---|---|---|
| 4,736,704 | 4/1988 | Henninger | 118/688 |
| 5,132,248 | 7/1992 | Drummond | 437/173 |
| 5,250,439 | 10/1993 | Muso | 435/25 |
| 5,312,654 | 5/1994 | Arimatsu | 427/511 |
| 5,385,848 | 1/1995 | Grimmer | 437/2 |
| 5,495,250 | 2/1996 | Ghaem | 342/51 |
| 5,880,176 | 3/1999 | Kamoto | 523/172 |
| 5,919,532 | 7/1999 | Sato | 428/1 |

FOREIGN PATENT DOCUMENTS 009828946   7/1998   WIPO .

*Primary Examiner*—Charles Bowers
*Assistant Examiner*—Matthew Whipple
*Attorney, Agent, or Firm*—Wolff & Samson

[57] ABSTRACT

A method of fabricating semiconductor devices using ink-jet printing is provided to directly deposit patterned polymer films to create OLED's and other semiconductor devices. The luminescence of poly-vinylcarbazol (PVK) films, with dyes of coumarin 6 (C6), coumarin 47 (C47), and nile red was similar to that of films of the same composition deposited by spin-coating. Light emitting diodes with low turn-on voltages were also fabricated in PVK doped with C6 deposited by ink-jet printing.

51 Claims, 12 Drawing Sheets

FABRICATION OF ORGANIC SEMICONDUCTOR DEVICES USING INK JET PRINTING

CROSS-REFRENCE TO RELATED APPLICATION

This Application claims the benefit of provisional application Ser. No. 60/073,068, filed Jan. 30, 1998. +gi

GOVERNMENT RIGHTS

The present invention has been made under contracts with DARPA, the National Science Foundation, and the New Jersey Commission on Science and Technology, and the government may have certain rights to the subject invention.

BACKGROUND OF THE INVENTION

1. Field of the Invention

The invention relates to methods of making semiconductor devices using organic active layers. The method involves the direct deposition of patterned luminescent doped polymers by ink jet printing, and the fabrication of organic light emitting diodes (OLED's) and other semiconductor devices from ink-jet-deposited organic films.

2. Related Art

Recently, there has been increased interest in light emitting diodes made from organic polymers because of their potential low cost and potential applicability to color flat panel displays. The organic materials are typically deposited by spin-coating (in the case of polymer materials), or by evaporation (in the case of small organic molecules). In either case, the single material covers the substrate so that only devices of a single color can generally be fabricated. The straightforward integration of multiple organic layers (for the fabrication of red, green, and blue emitters for color displays) would require the patterning of the individual organic layers. Because of their solubility in and sensitivity to aqueous solutions and many solvents, such patterning of organic materials by conventional photoresist and wet processing techniques is difficult. Efforts to date to integrate organic light emitting diodes (OLED's) from materials which emit different colors on the same substrate have patterned them only indirectly (through the use of cathodes evaporated through shadow mask as dry-etch masks), or avoided the issue all together by putting the three devices on top of each other (relying on shadow masks to pattern the organics so that contacts to the multiple layers may be made).

Different colors are obtained in light emitting diodes by placing red, green and blue emitting materials in proximity to each other using photoresist patterning and etching techniques to transfer the photoresist pattern into the polymer; however, such photoresist techniques are inapplicable to organic materials because the chemicals uses for the photoresist process are incompatible with organic materials. Similarly, patterning subsequent layers on top of the organic (such as metal contacts) is difficult for the same reason. Vacuum deposited organic layers and metals may be patterned by evaporating them through shadow masks, but this technology is difficult to extend to large areas.

Other efforts using ink-jet printing in the fabrication of semiconductor devices include:

U.S. Pat. No. 4,736,704 to Henninger, deposits solder masking to a circuit board using an inkjet like technique.

U.S. Pat. No. 5,132,248 to Drummond, et al., disclose the deposition of materials on a substrate by ink-jet printing. The materials are formulated as colloidal suspensions. The materials discloses are metals, alloys, dielectrics and superconductors.

However, none of these previous efforts relate directly to the deposition of organics on a substrate by ink-jet printing.

OBJECTS AND SUMMARY OF THE INVENTION

It is an object and advantage of the invention is to provide a method which enables the use of the direct deposition of patterned semiconducting polymers, including luminescent polymers and doped polymers by ink jet printing.

Another object of the present invention is to provide for the successful fabrication of organic light emitting diodes and other semiconductor devices from ink-jet-deposited organic films.

Still another object and advantage of the invention is to form devices of the class described with commercially available ink-jet printers.

A further object and advantage of the invention is the provision of a method using ink-jet printers where the ink cartridges are replaced with polymer solutions.

Even another object of the invention is to provide a method that employs a hole-transport polymer polyvinylcarbazol (PVK) and light emitting dyes coumarin 6 (C6), coumarin 47 (C47) and nile red dissolved into a chloroform solution.

A still further object and advantage of the invention is the provision of a method and apparatus which employs ink-jet printing where, after deposition, the chloroform evaporates leaving a doped polymer material.

An additional object of the present invention is to provide a resultant product from solutions having typical concentrations of PVK dissolved in chloroform of 10 g/l, and dye dissolved in chloroform of 0.1 g/l to yield on the order of 1% dye in the PVK.

An additional object of the present invention is the provision of a process for forming organic light emitting diodes and other semiconductor devices.

Even an additional object of the invention is to provide a process of forming organic light emitting diodes and other semiconductor devices using ink-jet printing.

Still even an additional object of the present invention is the ability to use ink-jet printing to deposit organic materials on a substrate.

Yet an additional object of the present invention is to provide a process using ink-jet printing for deposition of luminescent polymers.

A further object of this invention is the provision of a process using ink-jet printing for fabricating top and bottom contacts onto a substrate.

A still further object of the invention is the provision of a process for ink-jet fabrication of active or passive matrices.

The methods of this invention involve the direct deposition of patterned luminescent doped polymers by ink jet printing, and the fabrication of OLED's from ink-jet-deposited organic films. OLED's formed in accordance with this invention may have multiple organic layers on top of one another. Not all layers need be luminescent.

BRIEF DESCRIPTION OF THE DRAWINGS

Other important objects and features of the invention will be apparent from the following Detailed Description of the Invention taken in connection with the accompanying drawings in which.

DETAILED DESCRIPTION OF THE INVENTION

Figure 1A:
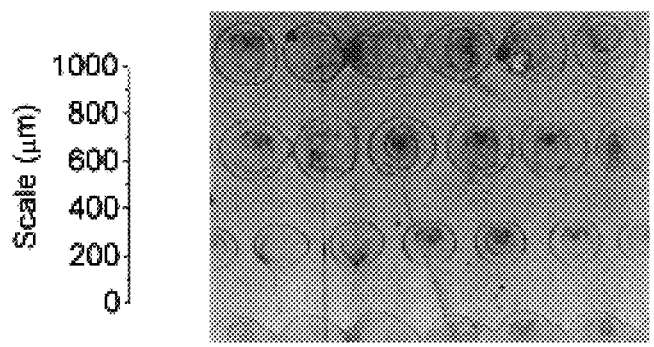
FIG. 1(a) is an optical micrograph of ink jet printed dots from above.

The present invention relates to a method of fabricating semiconductor devices, such as OLED's by ink-jet printing patterned luminescent polymer films.

In an example of the method of the present invention, the ink-jet printer used was a Cannon PJ-1080A Color Ink-Jet Printer with a resolution of 640 dots per line. This printer uses piezoelectric technology to squirt ink droplets from a nozzle with a 65-μm opening. There are four ink cartridges and four nozzles enabling the printer to print four different colors simultaneously. As the printer head scans the page and the piezoelectric materials are pulsed, ink is squirted from the nozzles onto the page. The only modification to the ink-jet printer for printing OLED's was to replace the ink cartridges with polymer solutions. Ink jet printing has previously been used to manufacture color-filters for Liquid Crystal Displays, but not to apply luminescent polymers.

The organic materials used were similar to those used by Wu, et al., IEEE Trans. Electron Devices 44, 1269 (1997), using doped polymer blends deposited by spin-coating, in which OLED's with over 1% external quantum efficiency and brightness of 4000 cd/m² were produced. The hole-transport polymer poly-vinylcarbazol (PVK) and light emitting dyes coumarin 6 (C6), coumarin 47 (C47) and nile red were dissolved into chloroform solution, which was then deposited by ink-jet printing, or spin coating for comparison. After deposition, the chloroform evaporates leaving a doped polymer material. Typical concentrations of PVK dissolved in chloroform were 10 g/l, and dye dissolved in chloroform were 0.1 g/l, yielding on the order of 1% dye in the PVK. These concentrations are less than those used for spin-coating, which were typically 15.4 g/l PVK in chloroform and 0.05 g/l dye in chloroform, yielding on the order of 0.3% dye in the PVK. In this initial ink-jet printing work, no electron transport agent was used. PVK, which had a high weight-average molecular weight $M_w$, of 1 100 000 g/mole reported by the supplier, was purchased from Aldrich Chemical Inc. and used as received. Green dye C6 and blue dye C47 were purchased from Lambda Physik Inc. Nile red was purchased from Aldrich. Chloroform solutions containing different amounts of PVK and luminescent materials were prepared by stirring and were passed through 0.45-μm filters. Ink-jet printed thin films were printed onto 175-μm thick flexible polyester coated with indium tin oxide (ITO). Before deposition, the ITO was treated with an oxygen plasma to modify its surface properties for OLED's.

Figure 2:
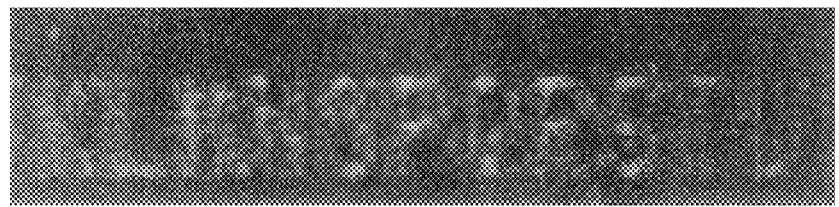
FIG. 2 is a photograph of ink-jet printed luminescent polymer letters of nile red doped PVK excited by an ultraviolet lamp. The letters ink-jet printed using "bold" mode.
Figure 1B:
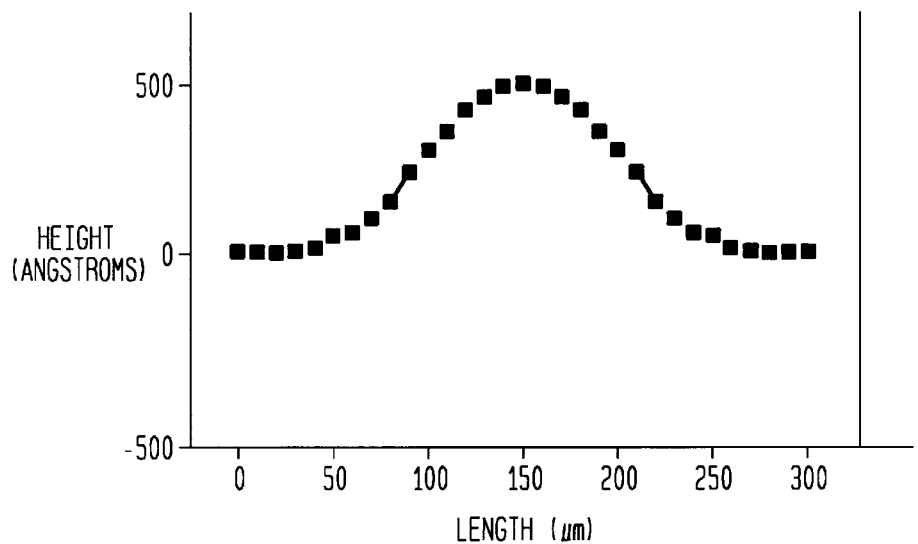
FIG. 1(b) is plot of the surface profile of a dot.

FIGS. 1(a) and 1(b) show an optical micrograph of a number of ink-jet printed dots and a surface profile of the shape of a typical dot. The thickness of the dots ranged from 400 to 700 Angstroms and the dot widths ranged from 150 to 200 μm. The larger diameter dots tended to be thicker, indicating thickness variation is due to the total amount of deposited solution. In the optical micrograph of FIG. 1 (a), some structure can be seen within the dot, which may be evidence of some mass transport due to segregation as the solvent evaporated. To demonstrate the ability of the ink-jet printing technique to deposit patterns, PVK doped with C6 dye was deposited with an ink-jet printed test pattern. This substrate was then illuminated using ultra violet excitation, and a photograph, FIG. 2, was taken of the red emission of the patterned polymer. A filter was used to cut out most of the 420 nm polyester/PVK luminescence. During the experiment the ink-jet printer was operated in the "bold" mode, which causes the printer to print every dot twice, which is why the letters appear double.

Figure 3:
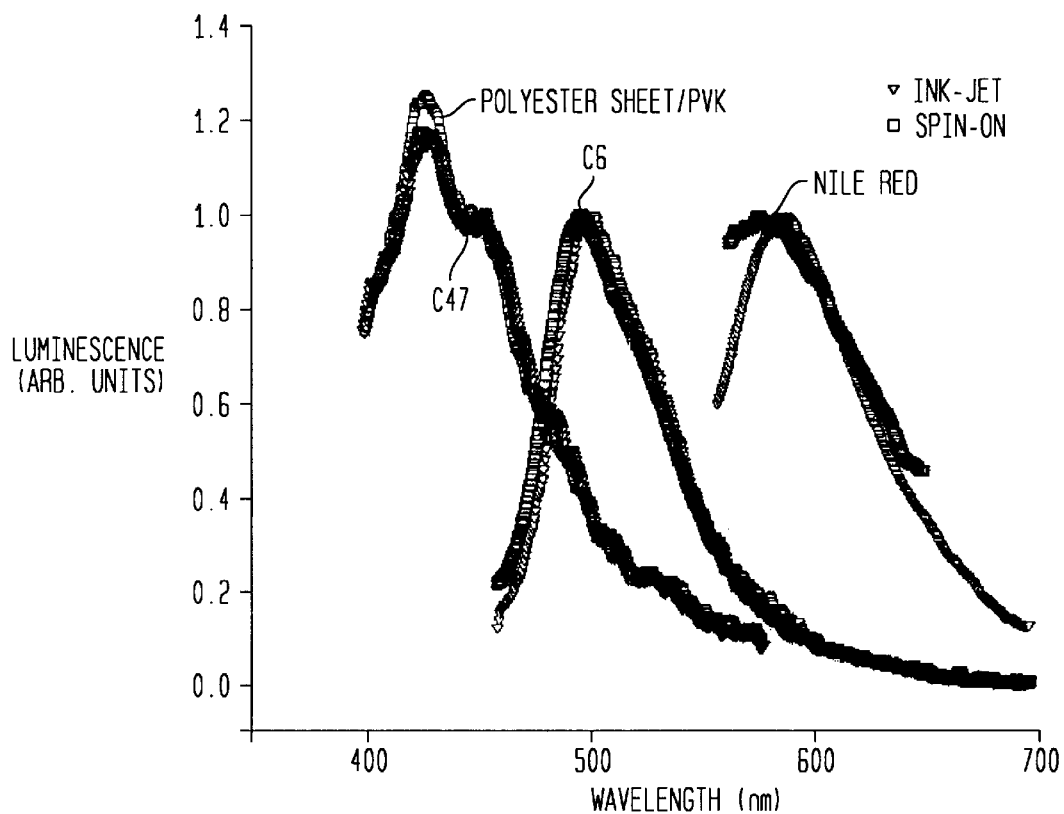
FIG. 3 is a plot of the photoluminescence spectra of ink-jet printed and spin-coated PVK film doped with C47 (blue), C6 (green), and nile red.

FIG. 3 shows the photoluminescence spectra of three individual ink-jet printed thin films and spin-coated films made from the same solution, each with a different dye. The spin-coated films were spun-on at a speed of 4000 rpm for 60s. The photoluminescence was measured using a Perkin-Elmer LS50 luminescence spectrometer with an excitation λ of 380 nm for the C47 doped film and 440 and 520 nm for C6 and nile red doped films, respectively. No significant difference in shape or magnitude is seen between the films prepared by ink-jet printing vs. spin coating. It should be noted that the peak of 420 nm in the C47 spectra is due to a combination of the polyester substrate and the PVK host, not the deposited film. The dye luminescence appears as a peak at 450 nm on the shoulder of the 420 nm peak.

It was difficult to fabricate devices directly on top of the polymer dots fabricated by ink-jet printing because of the difficulty in aligning a shadow mask for metal cathode formation directly over a polymer dot. Therefore to fabricate test devices the ink-jet printer was operated in a mode to create a continuous sheet of polymer rather than discrete dots. After ink-jet printing, the samples were loaded into a vacuum chamber with a base pressure of <10⁻³ torr for the metallization step of device fabrication. Typically, at least ~90 min were allowed between loading of samples and metal evaporation, and no further heating of samples was done. Top metal cathodes were deposited through a shadow mask to form an array of 250 μm diameter devices on the polymer film. Metal alloys such as Mg: Ag (10:1) were deposited by co-evaporation from two separate sources, followed by the deposition of Ag as a protective layer. The ITO on the polyester sheet served as the anode. The devices were then measured in air without any protective coating.

Figure 4:
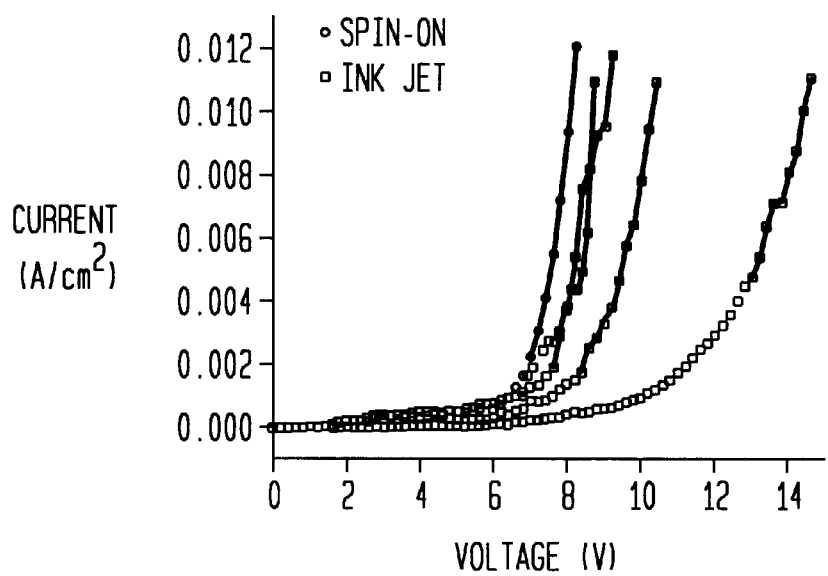
FIG. 4 is a plot of current vs. voltage for devices fabricated with ink-jet printed and spin-coated films of PVK doped with C6.
Figure 5:
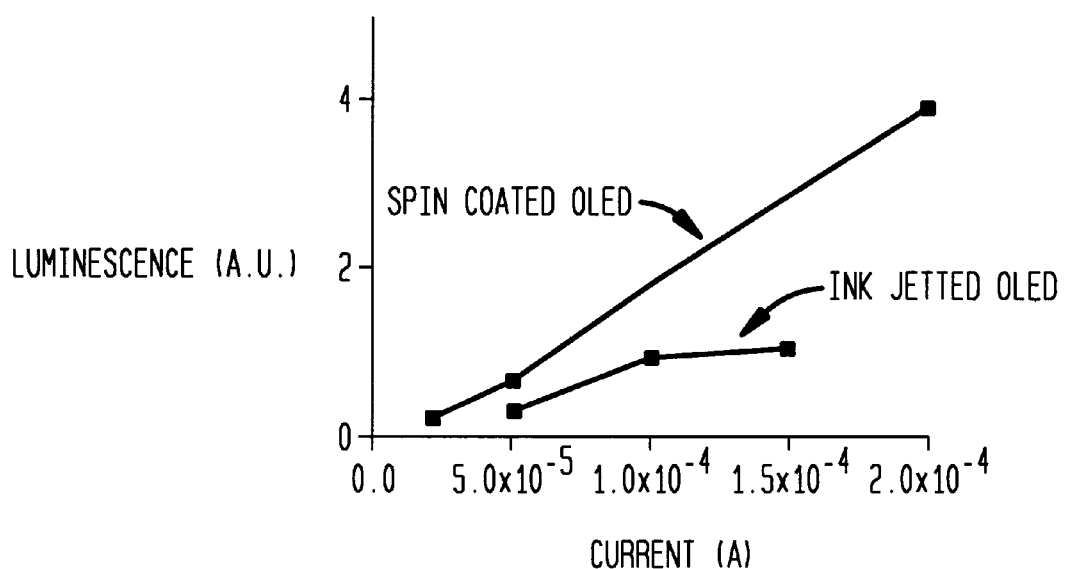
FIG. 5 is a plot of luminescence vs. current for two of the devices of FIG. 4.

FIG. 4 shows the I–V curves of typical devices made by this procedure and a control device fabricated on a film spin-coated from the same polymer solution. The organic film thickness of the control device was about 50 $\mu$m. Current densities of ~mA/cm$^2$ are achieved at a voltage of ~7V for the control device, and ~6–11 V for the ink-jet printed devices. Almost all of the voltages are lower than the drive voltage of ~10–11 V seen in Wu, et al. on doped PVK devices without an electron transport agent, but in Wu, et al. the organic thickness was ~100 nm. FIG. 5 shows the L-I characteristic of the two devices, which shows that the efficiency of the ink-jet printed device is about a factor of two less efficient than the spin coated device.

The methods of the present invention directly deposit the desired organic or other layers in the desired pattern using inkjet printing. In these methods, a liquid containing the desired materials or a precursor of the materials is deposited into a pattern. The liquid evaporates leaving the desired materials, or a precursor, which may be converted to the desired material, behind.

Patterning organics is important for color displays, in which separate red, green and blue devices are desired. When each devices made adjacent to each other, it is desirable to pattern 3 separate organic layers, each of which is typically first deposited over the entire surface, into three separate regions for the red, green and blue devices.

Figure 6A:
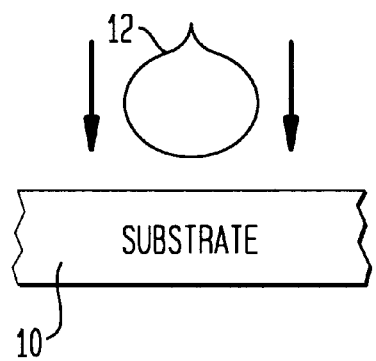
FIGS. 6a–6c illustrate the steps of the method of the present invention.
Figure 6B:
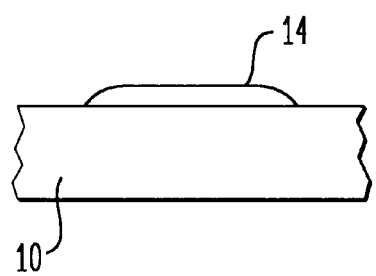

As more particularly shown in FIG. 6(a), droplets 12 of organic containing liquid carriers are deposited from an ink-jet printer in a local area on the surface of a substrate 10. As shown in FIG. 6(b), the liquid carriers evaporate to create local regions 14 of desired organic film. The steps of FIGS. 6(a)–6(b) are repeated as shown in FIG. 6(c), with a droplet 16 incident on a new region of the substrate to create another organic region.

Figure 6C:
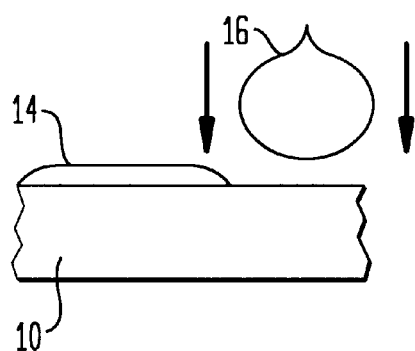
Figure 7A:
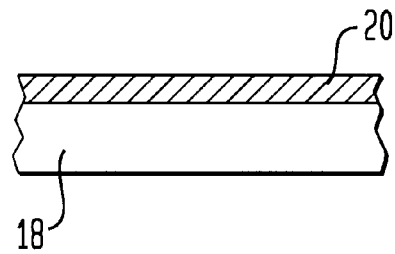
FIGS. 7a–7c illustrate the steps of fabricating organic light emitting diodes using ink-jet printing.
Figure 7B:
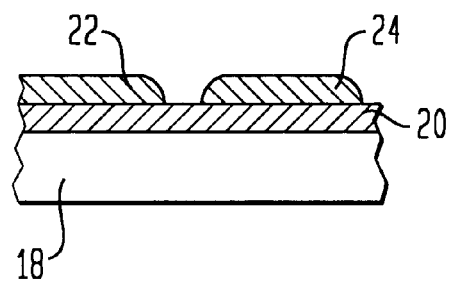
Figure 7C:
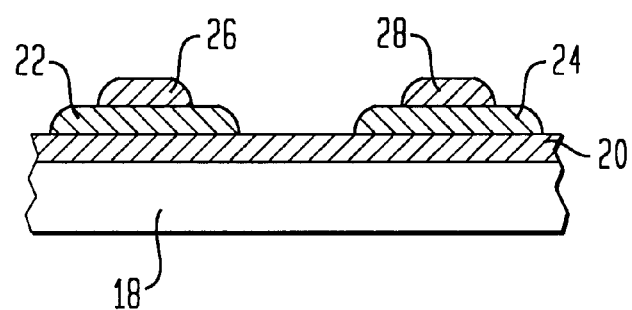

The methods of FIG. 6(a)–(c) are used in FIG. 7(a)–(c) to fabricate organic light emitting diodes. A substrate 18 and bottom electrode 20 (which may be the same structure) is shown in FIG. 7(a). The electrode may be patterned for individual electrical control. Organic "islands" 22, 24, FIG. 7(b) are deposited on the substrate 18 by ink-jet printing. Electrodes 26, 28 are applied on top of the areas 22, 24, of organic material on the substrate 18 by evaporation, through shadow masks.

Figure 8A:
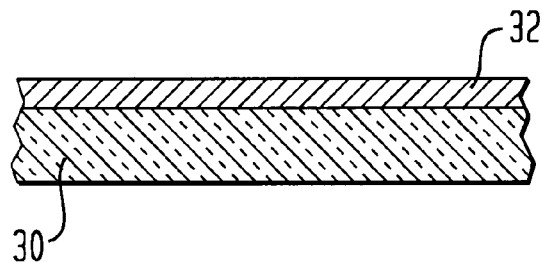
FIGS. 8a–8c illustrate the fabrication of red green and blue devices on a common substrate.
Figure 8B:
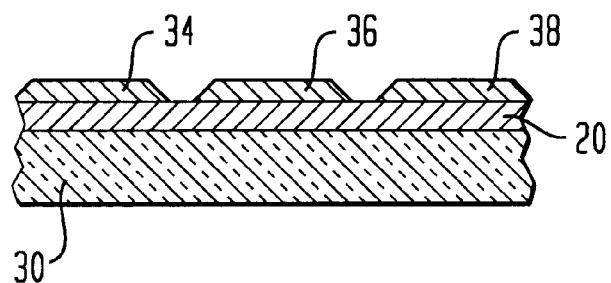
Figure 8C:
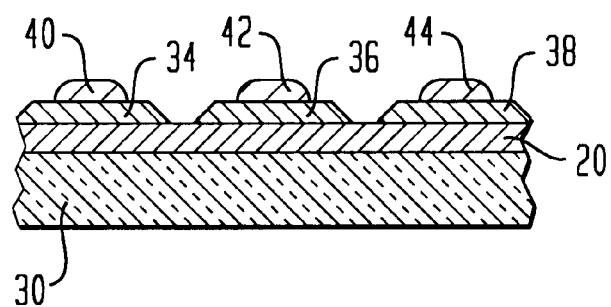

FIGS. 8(a)–(b) illustrate fabrication of red, green and blue devices on the same substrate. As shown in FIG. 8(a), a substrate 30, such as glass, and bottom electrode 32 similar to that shown and described in connection with FIG. 7(a) is prepared. In FIG. 8(b), organic "islands" 34, 36, 38 of three different types are placed on the substrate 30 by ink jet printing using three different solution types, as red, green and blue inks are used in a conventional ink-jet printer for color printing on paper. Top contacts 40, 42, 44 in FIG. 8(c), are applied to each area of organic material in a manner similar to that shown and described in connection with FIG. 7(c). In these devices, either the bottom or the top electrode or both may be patterned for individual electrical control. Each "island" of organic material may be formed by a single incident droplet, or several droplets, either directly on top of each other or laterally of each other.

Figure 9A:
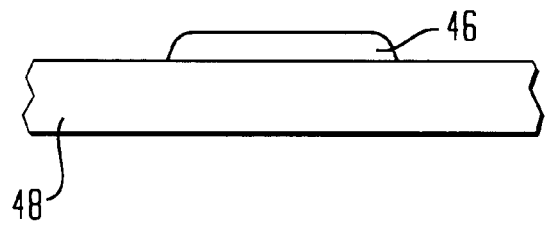
FIGS. 9a–9c illustrate the use of ink-jet printing for fabricating bottom contacts.
Figure 9B:
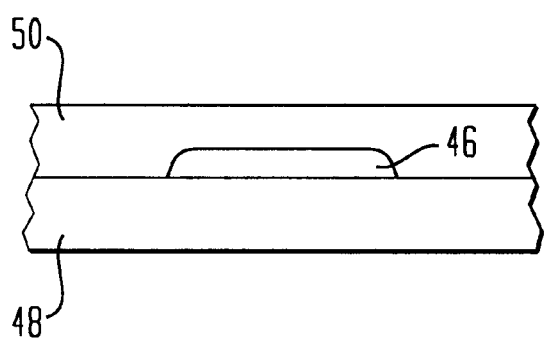
Figure 9C:
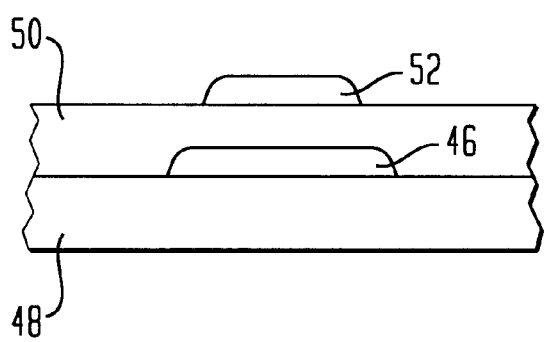

FIGS. 9(a)–(c) show fabrication of bottom contacts in a pattern using ink-jet printing. The organic "islands" may be formed using ink-jet printing as previously discussed in connection with FIGS. 6–8. As shown in FIG. 9(a) bottom contact 46 is formed on a substrate 48 by ink-jet printing. As shown in FIG. 9(b), organic materials 50 may be deposited onto the contact 46 by ink-jet printing in a desired pattern. As shown in FIG. 9(c) the top 52 contact may be deposited on the organic 50 by ink-jet printing.

Figure 10A:
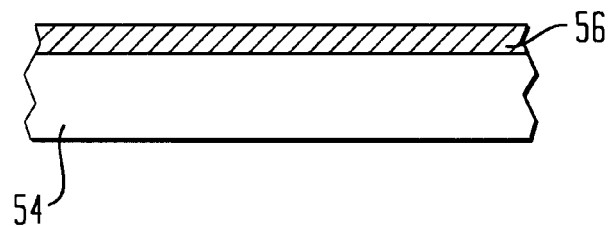
FIGS. 10a–10c illustrate fabrication of top contacts using ink-jet printing.
Figure 10B:
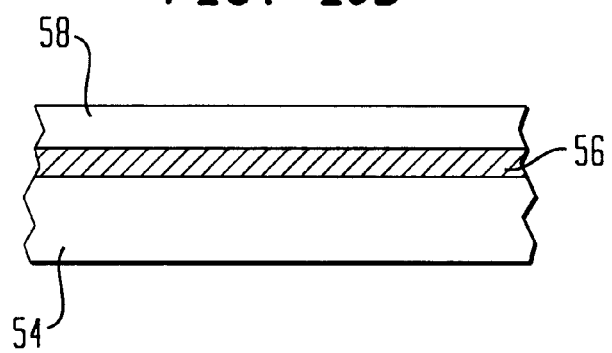
Figure 10C:
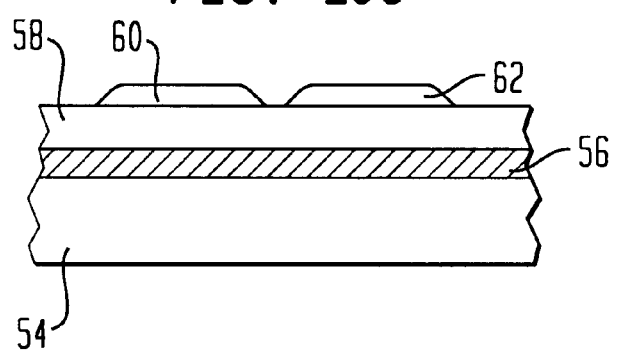

FIGS. 10(a)–(c) show fabrication of top contacts in a pattern using ink-jet printing. FIG. 10(a) illustrates the creation of the bottom electrodes 56, which may be created in a pattern on substrate 54. FIG. 10(b) shows the deposition of organic layers 58 onto electrodes 56 by ink-jet printing. As shown in FIG. 10(c), the top electrodes 60, 62 is deposited in a pattern by ink-jet printing over the organic layers 58.

In connection with FIGS. 9 and 10, the contacts may be formed of a precursor of the final metal, metal particles suspended in a solvent, a supersaturated solution which will yield solid metal (such as the Rochelle salt method), or an organic with good conductivity.

Figure 11A:
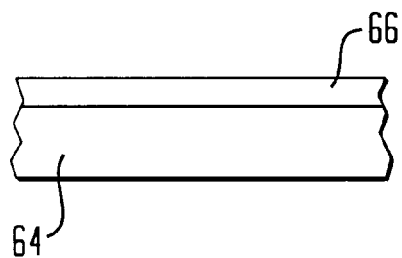
FIGS. 11a–11c illustrate the use of ink-jet printing to fabricate three color OLEDs.
Figure 11B:
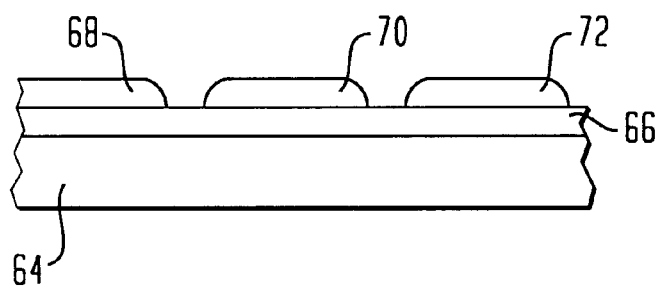
Figure 11C:
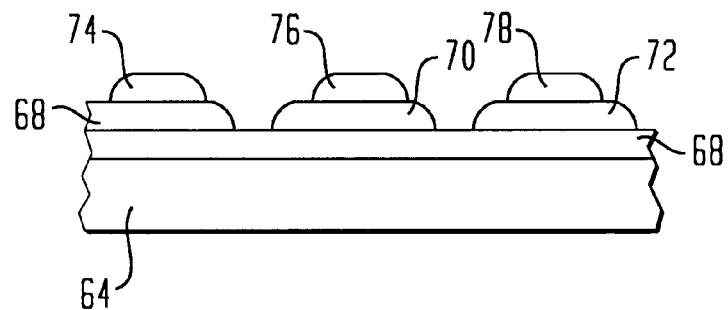

The techniques of FIGS. 9 and/or 10 may be combined with the steps described in FIGS. 6–8. FIGS. 11(a)–(c) illustrates the fabrication of three color OLED's with individual top contacts by inkjet printing. FIG. 11(a) shows a substrate 64 formed with bottom electrodes 66. The bottom electrodes may be patterned. As shown in FIG. 11(b), three types of organic, red, blue, and green, 68, 70, 72 are deposited by ink-jet printing. FIG. 11(c) illustrates the formation of top contacts 74, 76, 78 on the organic islands 68, 70, 72, respectively by ink-jet printing.

Figure 12A:
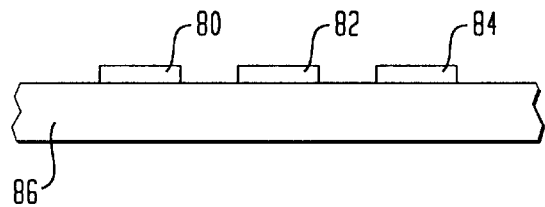
FIGS. 12a–12d illustrate the use ink-jet printing to fabricate a passive matrix.
Figure 12B:
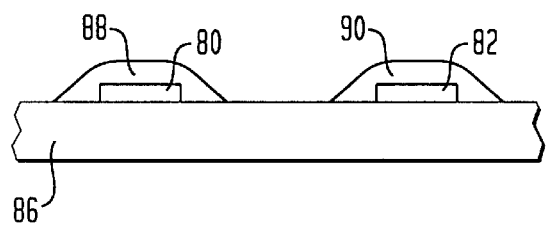
Figure 12C:
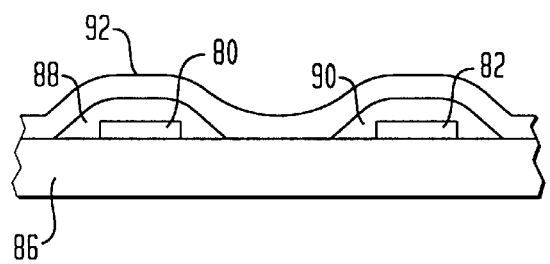
Figure 12D:
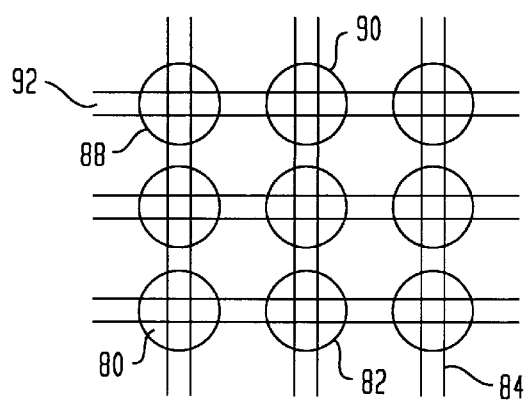

FIGS. 12(a)–(d) show formation of a passive matrix using the methods of the present invention. In FIG. 12(a), bottom electrode lines 80, 82, 84 are formed in one direction on substrate 86. As shown in FIG. 12(b), polymer islands 88, 90 are applied on top of the bottom electrode lines 80, 82 in regions to be crossed by the top electrode. These polymer islands 88, 90 may be of different emitting colors for a color display matrix. As shown in FIG. 12(c), the top contact lines 92 are applied perpendicular to the bottom contact lines. The final matrix thus produced is shown in FIG. 12(d).

Figure 13A:
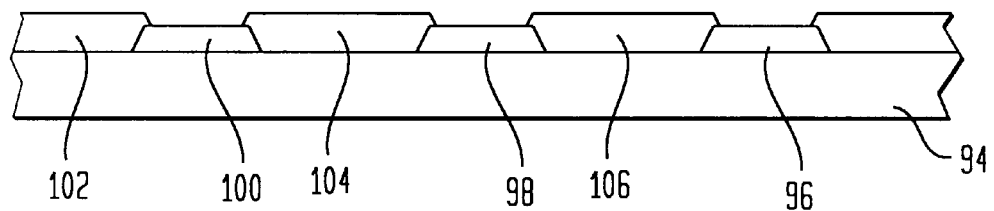
FIGS. 13a–13c illustrate the fabrication of an active matrix.
Figure 13B:
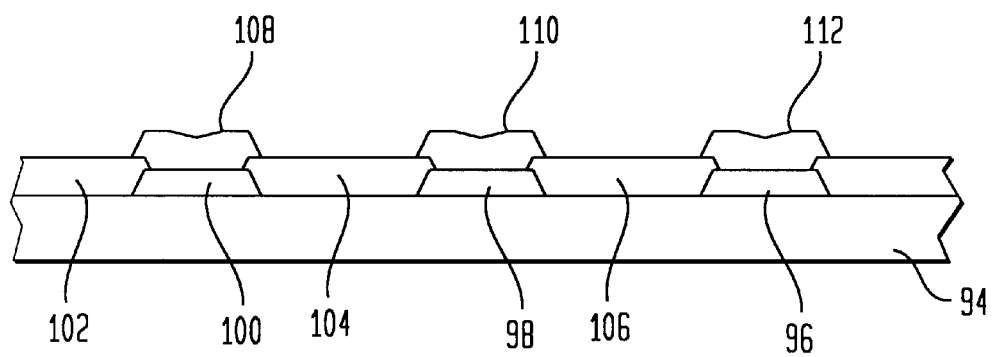
Figure 13C:
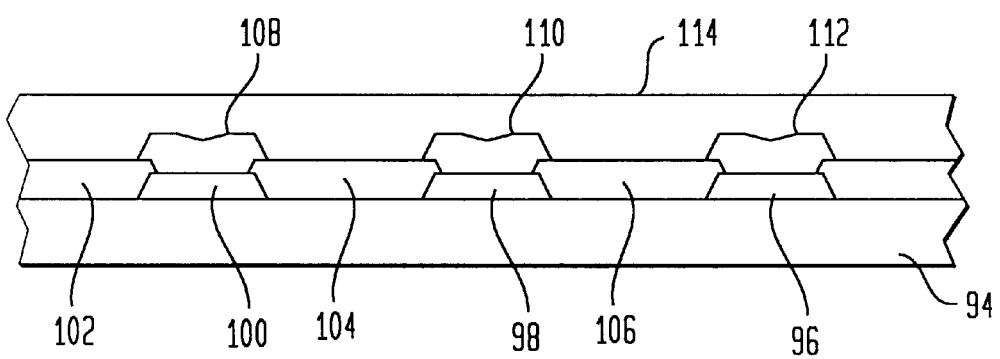

FIGS. 13(a)–(c) shown the formation of an active matrix using the methods of the present invention. In FIG. 13(a), individual bottom electrode surfaces 96, 98, 100 are formed on a substrate 94 and may be insulated from each other as shown at 102, 104, 106. These bottom electrodes may be connected to circuitry (not shown) which enables the bottom electrodes to be individually addressable. As shown in FIG. 13(b), organic "islands" 108, 110, 112 are deposited by ink-jet printing onto exposed bottom electrodes. These "islands" may be of different emitting color for a 1S color matrix. As shown in FIG. 13(c), the top electrode 114 (Al:Li or Mg:Ag) is applied over the "islands". The top electrode need not be patterned.

Figure 14A:
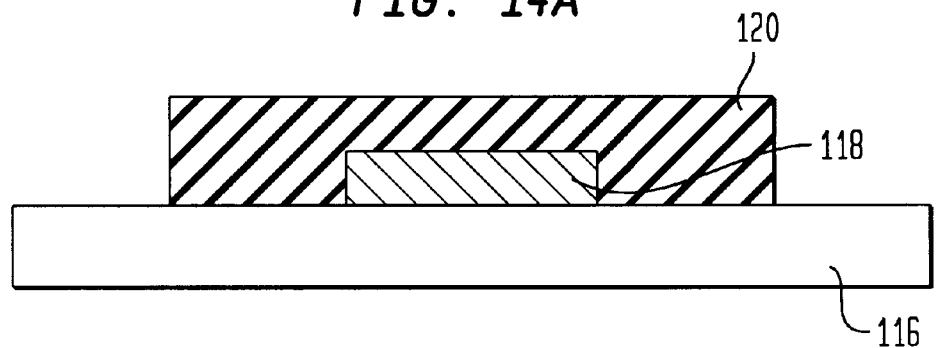
FIGS. 14(a)–(b) illustrate the formation of thin film field effect transistors.
Figure 14B:
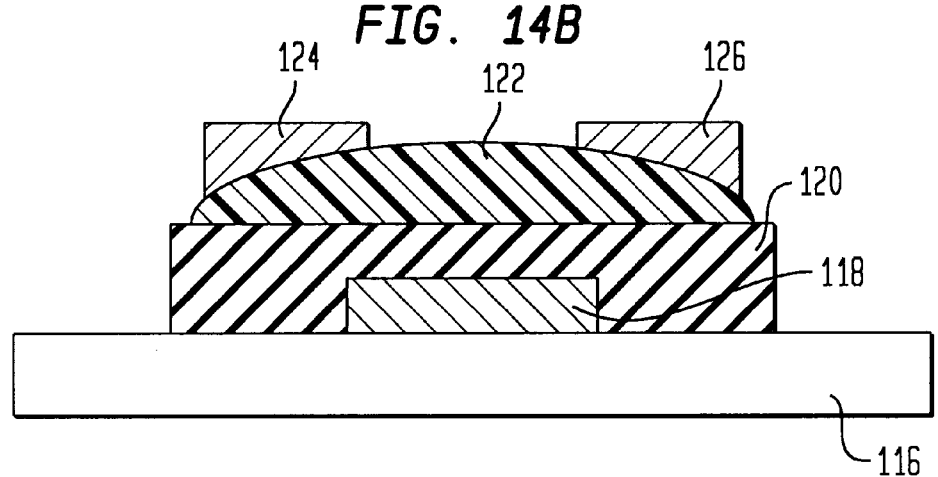

FIGS. 14(a)–(b) illustrate the formation of thin film field effect transistors with organic as the semiconducting layer. FIG. 14 (a) shows a substrate 116 on which gate electrode 118 is formed. Gate electrode 118 may be metal or a conducting polymer. Gate insulator 120 is formed over the gate electrode 118. Insulator 120 may be formed of organic or inorganic material. In FIG. 14(b), a polymer semiconducting layer 122 of poly-thiophene, for example, is formed by ink-jet printing over insulator 120. Source/drain contacts 124, 126 are formed on semiconducting layer 122 by conventional methods. Contacts 124, 126 may be formed of gold or a conducting polymer. The source/drain contacts 124, 126 may be formed before forming the polymer semiconducting layer 122. Further, the gate insulator 120 be also be formed by ink-jet printing of a material such as polyamide.

Figure 15:
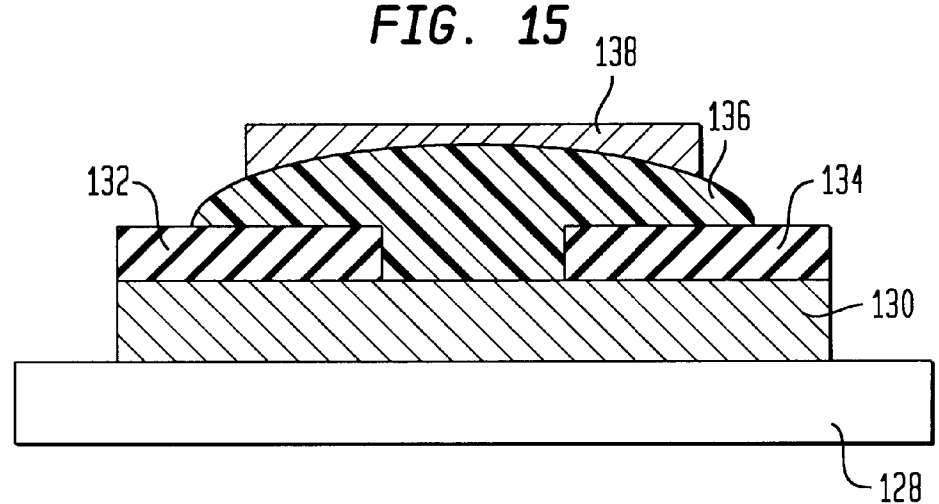
FIG. 15 illustrates a modified method of fabricating OLED devices

FIG. 15 illustrates a modified method of fabricating OLED devices. Substrate 128 has bottom contact 130 formed thereon. Bottom contact 130 may be patterned. Insulator 132, 134 formed thereon. Organic material 136 is formed by ink-jet printing over the insulator 132, 134. Top contact 138 is formed over organic 136. The top contact 138 may be patterned. In this approach, where insulator 132, 134 is patterned over the bottom contact 130, the patterned insulator may adjust the wetting and drying of the liquid drop applied by ink-jet printing. The patterned insulator 132, 134 also restricts the OLED to a small portion of the final polymer dot. In both of the foregoing a cases, thickness of the polymer in the final active OLE device is controlled as desired.

Having thus described the invention in detail, it is to be understood that the foregoing description is not intended to limit the spirit and scope thereof. What is desired to be protected by Letters Patent is set forth in the appended claims.

What is claimed is:

1. A process for forming a pattern on a substrate by deposition of an organic material comprising the steps of:
   depositing a semiconducting organic material in a solvent onto a substrate by ink-jet printing; and
   evaporating the solvent, whereby said organic material remains on the substrate.

2. The process of claim 1, further comprising drying the deposited material to remove said solvent.

3. The process of claim 1 wherein said organic material is a luminescent polymer.

4. The process of claim 1 wherein said material includes polyvinylcarbazol film.

5. The process of claim 1 wherein said solvent is chloroform.

6. The process of claim 1 wherein said material includes light emitting dyes.

7. The process of claim 6 wherein said light emitting dyes include coumarin and nile red.

8. The process of claim 7 wherein said coumarin is coumarin 6.

9. The process of claim 7 wherein said coumarin is coumarin 47.

10. The process of claim 7 wherein said coumarin is coumarin 6 and coumarin 47.

11. The process of claim 1 wherein said organic material is a mixture of polymers and other organic molecules.

12. A process for making organic light emitting diodes comprising the steps of:
    depositing a semiconducting organic material in a solvent onto a substrate by ink-jet printing; and
    evaporating the solvent, said organic material remaining on the substrate.

13. The process of claim 12 wherein said depositing step operates an ink-jet printer in a mode to create a continuous sheet of polymer.

14. The process of claim 13 further including the step of metallizing said ink-jet printed substrates.

15. The process of claim 14 further including the step of depositing with ink-jet printing top metal contacts on said substrate.

16. The process of claim 15 wherein said top metal contacts are deposited through a shadow mask.

17. The process of claim 12 further including the step of depositing with ink-jet printing bottom metal contacts on said substrate.

18. The process of claim 15 wherein said top metal contacts are deposited in a pattern.

19. The process of claim 17 wherein said bottom metal contacts are deposited in a pattern.

20. The process of claim 12 further wherein said organic material includes light emitting dyes.

21. The process of claim 20 further including the step of depositing top contacts on said organic material by ink jet printing.

22. The process of claim 21 further including the step of depositing bottom contacts on said substrate by ink-jet printing.

23. A process of forming thin film field effect transistors comprising the steps of:
    forming a gate electrode on a substrate;
    forming a gate insulator over said gate electrode;
    forming a polymer semiconducting layer on said insulator by ink-jet printing; and
    forming source and drain contacts on said semiconducting layer.

24. The process of claim 23 wherein said gate insulator is formed by ink-jet printing, and the semiconducting layer by other techniques.

25. The process of claim 23 wherein the source and drain contacts are applied directly on the gate insulator before the semiconducting layer is deposited.

26. The process of claim 24 wherein the source and drain contacts are applied directly on the gate insulator before the semiconducting layer is deposited.

27. The process of claim 23 wherein the semiconducting layer comprises a non-polymeric organic film or a polymer/small organic molecule blend.

28. The process of claim 24 wherein the semiconducting layer comprises a non-polymeric organic film or a polymer/small organic molecule blend.

29. The process of claim 25 wherein the semiconducting layer comprises a non-polymeric organic film or a polymer/small organic molecule blend.

30. A process for forming a pattern on a substrate by deposition of an organic material comprising the steps of:
    depositing organic material including polyvinylcarbazol film in a solvent onto a substrate by ink-jet printing; and
    evaporating the solvent, whereby said organic material remains on the substrate.

31. The process of claim 30, further comprising drying the deposited material to remove said solvent.

32. The process of claim 30 wherein said organic material is semiconducting.

33. The process of claim 30 wherein said organic material is a luminescent polymer.

34. The process of claim 30 wherein said solvent is chloroform.

35. The process of claim 30 wherein said material includes light emitting dyes.

36. The process of claim 35 wherein said light emitting dyes include coumarin and nile red.

37. The process of claim 36 wherein said coumarin is coumarin 6.

38. The process of claim 36 wherein said coumarin is coumarin 47.

39. The process of claim 36 wherein said coumarin is coumarin 6 and coumarin 47.

40. The process of claim 30 wherein said organic material is a mixture of polymers and other organic molecules.

41. A process for making organic light emitting diodes comprising the steps of:
    depositing organic material including polyvinylcarbazol film in a solvent onto a substrate by ink-jet printing; and evaporating the solvent, said organic material remaining on the substrate.

42. The process of claim 41 wherein said depositing step operates an ink-jet printer in a mode to create a continuous sheet of polymer.

43. The process of claim 42 further including the step of metallizing said ink-jet printed substrates.

44. The process of claim 43 further including the step of depositing with ink-jet printing top metal contacts on said substrate.

45. The process of claim 44 wherein said top metal contacts are deposited through a shadow mask.

46. The process of claim 41 further including the step of depositing with ink-jet printing bottom metal contacts on said substrate.

47. The process of claim 44 wherein said top metal contacts are deposited in a pattern.

48. The process of claim 46 wherein said bottom metal contacts are deposited in a pattern.

49. The process of claim 41 further wherein said organic material includes light emitting dyes.

50. The process of claim 49 further including the step of depositing top contacts on said organic material by ink jet printing.

51. The process of claim 50 further including the step of depositing bottom contacts on said substrate by ink-jet printing.

* * * * *